US012568633B2

(12) United States Patent
Peng et al.

(10) Patent No.: US 12,568,633 B2
(45) Date of Patent: Mar. 3, 2026

(54) HIGH-DENSITY THREE-DIMENSIONAL MULTILAYER MEMORY AND FABRICATION METHOD

(71) Applicant: CHENGDU PBM TECHNOLOGY LTD., Chengdu (CN)

(72) Inventors: Jack Zezhong Peng, San Jose, CA (US); Ke Wang, Chengdu (CN)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 72 days.

(21) Appl. No.: 17/998,431

(22) PCT Filed: Oct. 9, 2021

(86) PCT No.: PCT/CN2021/122754
§ 371 (c)(1),
(2) Date: Nov. 10, 2022

(87) PCT Pub. No.: WO2023/273003
PCT Pub. Date: Jan. 5, 2023

(65) Prior Publication Data
US 2024/0224546 A1 Jul. 4, 2024

(30) Foreign Application Priority Data
Jul. 2, 2021 (CN) .......................... 202110751815.3

(51) Int. Cl.
*H10B 99/00* (2023.01)
*H10B 53/10* (2023.01)
(Continued)

(52) U.S. Cl.
CPC ............. *H10B 99/16* (2023.02); *H10B 53/10* (2023.02); *H10B 53/20* (2023.02); *H10B 61/00* (2023.02); *H10B 63/10* (2023.02); *H10B 63/845* (2023.02)

(58) Field of Classification Search
CPC ........ H10B 99/16; H10B 53/10; H10B 53/20; H10B 61/00; H10B 63/10; H10B 63/845;
(Continued)

(56) References Cited

U.S. PATENT DOCUMENTS 8,124,968 B2 2/2012 Koo et al.
9,859,299 B2 1/2018 Park et al.
(Continued)

FOREIGN PATENT DOCUMENTS

CN 101615656 12/2009
CN 106910743 A * 6/2017
(Continued)

OTHER PUBLICATIONS

PCT International Application No. PCT/CN21/122754, International Search Report, dated Jul. 2, 2021, 4 pages.
(Continued)

*Primary Examiner* — William B Partridge
*Assistant Examiner* — Linda J. Fleck
(74) *Attorney, Agent, or Firm* — DLA Piper LLP (US)

(57) ABSTRACT

The present disclosure provides a high-density three-dimensional multilayer memory and a preparation method. The preparation method of the memory comprises the following steps: firstly, forming a basic structure body; secondly, slotting the basic structure body; thirdly, forming a preset number of memory cell holes in the a segmentation groove, an insulating medium being arranged between every two adjacent memory cell holes, a vertical electrode being arranged in the memory cell hole, and a memory medium layer being arranged between the vertical electrode and an interdigital structure; and in the third step, before the memory medium is arranged, the preparation method comprises the following steps: performing doping diffusion on the first conducting medium located on the inner wall of the
(Continued)

segmentation groove, so that the first conducting medium close to the inner wall of the segmentation groove forms a buffer area made of a low-doped semiconductor material.

4 Claims, 17 Drawing Sheets

(51) Int. Cl.

| | | |
|---|---|---|
| *H10B 53/20* | (2023.01) | |
| *H10B 61/00* | (2023.01) | |
| *H10B 63/00* | (2023.01) | |
| *H10B 63/10* | (2023.01) | |

(58) Field of Classification Search
 CPC ........ H10B 63/20; H10B 20/20; H10N 70/20; H10N 70/231; H10N 70/8828; H10N 70/8833
 See application file for complete search history.

(56) References Cited

U.S. PATENT DOCUMENTS

| | | | | |
|---|---|---|---|---|
| 9,935,124 | B2 * | 4/2018 | Nishikawa | ............. H10B 43/40 |
| 10,050,056 | B2 | 8/2018 | Park et al. | |
| 10,497,716 | B2 | 12/2019 | Park et al. | |
| 2009/0321878 | A1 | 12/2009 | Koo et al. | |

| | | | | |
|---|---|---|---|---|
| 2012/0119180 | A1 | 5/2012 | Koo et al. | |
| 2017/0323899 | A1 * | 11/2017 | Park | ..................... H10D 64/037 |
| 2018/0097013 | A1 | 4/2018 | Park et al. | |
| 2018/0323211 | A1 | 11/2018 | Park et al. | |
| 2020/0350203 | A1 * | 11/2020 | Fratin | .................. H10B 63/845 |
| 2021/0005664 | A1 * | 1/2021 | Fratin | .................... H10B 63/30 |
| 2022/0189548 | A1 * | 6/2022 | Fantini | .............. G11C 13/0004 |
| 2023/0032006 | A1 * | 2/2023 | Fantini | .............. G11C 13/0004 |
| 2023/0171955 | A1 * | 6/2023 | Peng | ...................... H10B 20/25 |
| | | | | 438/600 |
| 2024/0349496 | A1 * | 10/2024 | Wang | .................... H10B 20/25 |

FOREIGN PATENT DOCUMENTS

| | | | |
|---|---|---|---|
| CN | 109545787 | | 3/2019 |
| CN | 109686703 | | 4/2019 |
| CN | 109887923 | A * | 6/2019 |
| CN | 111799264 | | 10/2020 |
| CN | 112992906 | | 6/2021 |
| CN | 113035874 | | 6/2021 |

OTHER PUBLICATIONS

Office Action of Chinese Application No. 202110751815.3 dated Mar. 31, 2023, 12 pages.
Office Action of Chinese Application No. 202110751815.3 dated Aug. 11, 2023, 8 pages.

* cited by examiner

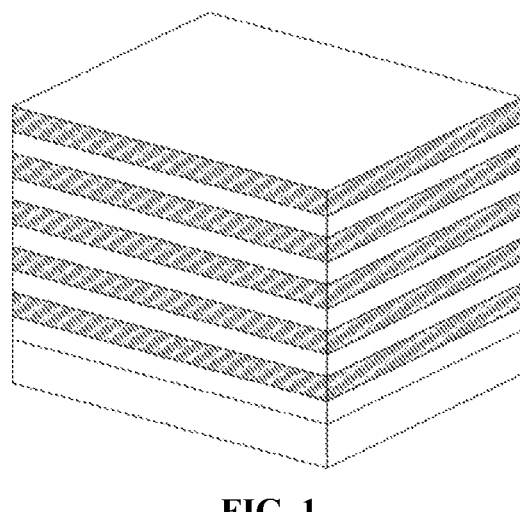
FIG. 1
FIG. 2
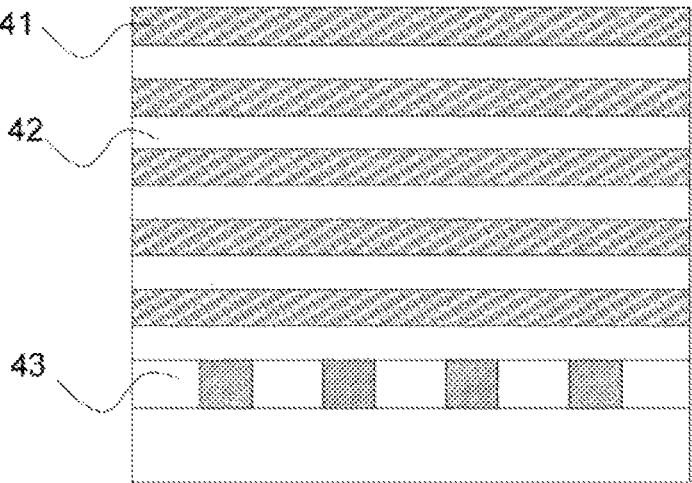
FIG. 3

A

A'

71

A

A'

110

110

110

HIGH-DENSITY THREE-DIMENSIONAL MULTILAYER MEMORY AND FABRICATION METHOD

CROSS-REFERENCE TO RELATED APPLICATION

This patent is a 371 application of PCT/CN2021/122754, filed on Oct. 9, 2021, which claims priority to CN application No. 202110751815.3, filed on Jul. 2, 2021, the disclosures of which are incorporated by reference herein in their entireties as part of the present application.

TECHNICAL FIELD

The present disclosure relates to the preparation technology of memories.

BACKGROUND

In the prior art, various digital storage technologies, including Erasable Programmable Read-Only Memory (EPROM), Electrically Erasable Programmable Read-Only Memory (EEPROM), flash memory, NAND-flash memory, hard disk, compact disc (CD), digital versatile disc (DVD), Blue-ray discs registered by the Blue-ray Disk Association, have been widely used for data storage for over 50 years. However, the lifetime of the storage medium is generally less than 5 to 10 years. The anti-fuse memory technology for big data storage is very expensive and low in memory density, and cannot meet the requirement of mass data storage.

According to the three-dimensional memory in the prior art, when the memory density is increased and the area of a memory unit is reduced, if a vertical electrode is made of N-/N+ or P-/P+ polycrystalline silicon with high resistivity, the electrode resistance is relatively high, which may give rise to a potential difference between the vertical electrodes in different layers, as well as relatively high series resistance of the memory unit, which may worsen the working performance of the normal memory.

SUMMARY

The technical problem to be solved by the present disclosure is to provide a high-density three-dimensional multilayer memory. The high-density three-dimensional multilayer memory has the characteristics of high density, low cost, low resistance for vertical electrodes, and the like.

The present disclosure also provides a fabrication method of the high-density three-dimensional multilayer memory. The fabrication method also has the advantages of processing simplification and high yield besides the above-mentioned advantages of the prepared memory.

Through the technical scheme adopted for solving the technical problem, the high-density three-dimensional multilayer memory comprises an underlying circuit part and a basic structure body disposed above the underlying circuit part, wherein the basic structure body is divided into two independent interdigitated structures, referred to as a first interdigitated structure and a second interdigitated structure respectively, by a curve-shaped division groove, wherein the basic structure body comprises first conducting medium layers and insulating medium layers alternately stacked on top of each other from bottom to top, wherein at least three memory cell holes are formed in the curve-shaped division groove side by side, a vertical electrode is disposed in each memory cell hole, and an insulating isolation pillar is disposed between every two adjacent memory cell holes;

the vertical electrode, the first conducting medium layer of the interdigitated structure and a memory medium between the vertical electrode and the first conducting medium layer form a memory structure;

the memory can be a PN junction type semiconductor memory or a Schottky semiconductor memory;

wherein, the memory medium is an insulating medium; and a buffer region is placed in the first conducting medium layer close to the memory medium, wherein the buffer region is embedded in the first conducting medium layer, and connected to the memory medium.

Further, the vertical electrode is in an electrical connection with the underlying circuit part.

The first conducting medium is made of a P-type semiconductor, and the vertical electrode is made of an N-type semiconductor, wherein the buffer region is made of a semiconductor material of which the doping type is the same as that of the first conducting medium and the doping concentration is lower than that of the first conducting medium;

or, the first conducting medium layer is an N-type semiconductor, and the vertical electrode is made of a P-type semiconductor, wherein the buffer region is made of a semiconductor material of which the doping type is the same as that of the first conducting medium and the doping concentration is lower than that of the first conducting medium;

or, the first conducting medium layer is made of a semiconductor material meeting the requirement of a Schottky diode, and the vertical electrode is made of a metal meeting the requirement of the Schottky diode, wherein the buffer region is made of a semiconductor material of which the doping type is the same as that of the first conducting medium and the doping concentration is lower than that of the first conducting medium.

The memory also may be a resistance change memory, a magnetic phase change memory, a phase change memory or a ferroelectric memory.

The present disclosure also provides a fabrication method of a high-density three-dimensional multilayer memory, comprising the following steps:

firstly, forming a basic structure body: setting up a preset number of first conducting medium layers and insulating medium layers in such a manner that the first conducting medium layers and the insulating medium layers are alternately stacked on top of each other to form a basic structure body;

secondly, grooving the basic structure body: forming a curve-shaped division groove penetrating from the top layer to the bottom layer of the basic structure body, and dividing the basic structure body into two staggered and separated interdigitated structures by the division groove;

thirdly, forming a preset number of memory cell holes in the division groove, wherein an insulating medium is disposed between every two adjacent memory cell holes, a vertical electrode is disposed in the memory cell hole, and a memory medium layer is disposed between the vertical electrode and the interdigitated structure; the vertical electrode, the memory medium and the first conducting medium are made of materials meeting the requirements of a preset memory, and the preset memory is a PN junction type semiconductor memory or a Schottky semiconductor memory; and in the third step, before the memory medium is disposed, the fabrication method comprises the following step:
    performing inversion doping diffusion or impurity out-diffusion on a first conducting medium located on the inner wall of the division groove, so that the area, close to the inner wall of the division groove, of the first conducting medium layer forms a buffer region.
In the third step, the memory cell hole is a hole penetrating through the basic structure body.
The third step comprises the following substeps:
3.1, performing inversion doping diffusion or impurity out-diffusion on the first conducting medium located on the inner wall of the division groove so that the first conducting medium close to the inner wall of the division groove forms the buffer region, wherein the conductive type of the buffer region is the same as that of the first conducting medium and the doping concentration of the buffer region is lower than that of the first conducting medium;
3.2, filling the insulating medium in the division groove, and etching the filled insulating medium to form the memory cell holes disposed along the division groove until the basic structure body is exposed to the memory cell hole;
3.3, depositing an insulating material as a memory medium on the inner wall of the memory cell hole to form a memory medium layer covering the inner wall of the memory cell hole;
3.4, placing a vertical electrode in the memory cell hole; and
the materials of the conducting medium layer, the middle medium layer and the vertical electrode layer meet one of the following conditions:
(a), the first conducting medium layer is a P-type semiconductor, and the vertical electrode layer is an N-type semiconductor;
(b), the first conducting medium layer is an N-type semiconductor, and the vertical electrode layer is a P-type semiconductor; and
(c), the first conducting medium layer is made of a semiconductor material meeting the requirement of a Schottky diode, and the vertical electrode is made of a metal meeting the requirement of the Schottky diode.
Or, the third step comprises the following substeps:
(3.1), filling the insulating medium in the division groove, etching the filled insulating medium to form the memory cell holes disposed along the division groove;
(3.2), performing inversion doping diffusion or impurity out-diffusion on the first conducting medium located at the inner wall of the division groove in the memory cell hole so that the first conducting medium close to the inner wall of the division groove forms the buffer region, wherein the conductive type of the buffer region is the same as that of the first conducting medium and the doping concentration of the buffer region is lower than that of the first conducting medium;
(3.3), depositing an insulating material as a memory medium in the memory cell hole to form a memory medium layer covering the inner wall of the memory cell hole;
(3.4), placing a vertical electrode in the memory cell hole; and
the materials of the conducting medium layer, the middle medium layer and the vertical electrode layer meet one of the following conditions:

(a), the first conducting medium layer is a P-type semiconductor, and the vertical electrode layer is an N-type semiconductor;
(b), the first conducting medium layer is an N-type semiconductor, and the vertical electrode layer is a P-type semiconductor; and
(c) the first conducting medium layer is made of a semiconductor material meeting the requirement of a Schottky diode, and the vertical electrode is made of a metal meeting the requirement of the Schottky diode.
The memory has the beneficial effects that the memory is high in memory density and low in interlayer resistance, and improves the stability of the memory work performance. The fabrication method is low in processing cost and high in yield, wherein a multilayer 2-bit OTP memory unit is formed from a semiconductor deep groove through deep well medium isolation, only two times of deep trench etching and filling are needed in the process, and cell isolation and left and right interdigitated isolation can be completed in one step. Only the minimum size of a memory cell array is limited by the deep trench etching process, and the minimum size of the isolation groove only needs to be thick enough to achieve an insulation effect, so that higher memory density can be obtained. The programmable medium of the memory cell is not damaged by the etching process, so the consistency is relatively good, and specifically, the process parameters are easier to control.

BRIEF DESCRIPTION OF THE DRAWINGS

FIG. 1 is a three-dimensional schematic diagram of a basic structure body.
FIG. 2 is a schematic top view of a prototype structure body in the present disclosure.
FIG. 3 is a front-view schematic cross-sectional view of a prototype structure body in the present disclosure.

DETAILED DESCRIPTION OF THE EMBODIMENTS

Ideally, the widths of the top and the bottom of grooves or holes formed by the etching process are consistent, but in the actual process, it is very difficult to keep the top and the bottom consistent. The schematic cross-sectional view of a prototype structure body in the A-A' direction is shown according to actual conditions, so the division groove is a trapezoid with a wide upper part and a narrow lower part on the longitudinal profile view. For simplicity, the top view does not show the trapezoidal structure and is hereby described.

The material of each part of the present disclosure may be one of the four items in the following table:

| | First conducting medium | Buffer layer | Memory medium | Vertical electrode |
|---|---|---|---|---|
| 1 | N+ semiconductor | Lightly-doped N-type semiconductor | Insulating medium | P+ semiconductor |
| 2 | N+ semiconductor | Lightly-doped N-type semiconductor | Insulating medium | P-type Schottky metal such as Al, Ag, Au and Pt |
| 3 | P+ semiconductor | Lightly-doped P-type semiconductor | Insulating medium | N+ semiconductor or conductor |
| 4 | P+ semiconductor | Lightly-doped P-type semiconductor | High insulating medium | N-type Schottky metal such as N + Poly, N + Si, and IZO (IZO indium zinc oxide) |

In the present disclosure, if the first conducting medium is a semiconductor, the conductive type (P type or N type) of the buffer layer being a buffer region formed by inversion doping diffusion or impurity out-diffusion, is the same as that of the first conducting medium, but the doping concentration is lower than that of the first conducting medium. If the memory is a PN junction memory, the vertical electrode is a P-type semiconductor, and the first conducting medium is an N-type semiconductor, wherein the buffer region is a lightly-doped N-type semiconductor (namely, an N-semiconductor). If the memory is a Schottky memory, the vertical electrode is P-type Schottky metal, and the first conducting medium is an N-type semiconductor, wherein the buffer region is a lightly-doped N-type semiconductor (namely, an N-semiconductor).

Embodiment I

This embodiment is the first embodiment of the fabrication method. The fabrication method comprises the following steps:

A1, forming a basic structure body on an underlying circuit 43: setting up a preset number of first conducting medium layers and insulating medium layers in such a manner that the first conducting medium layers 41 and the insulating medium layers 42 are alternately stacked on top of each other to form a basic structure body, referring to FIG. 2 and FIG. 3.

Figures 4, 5:
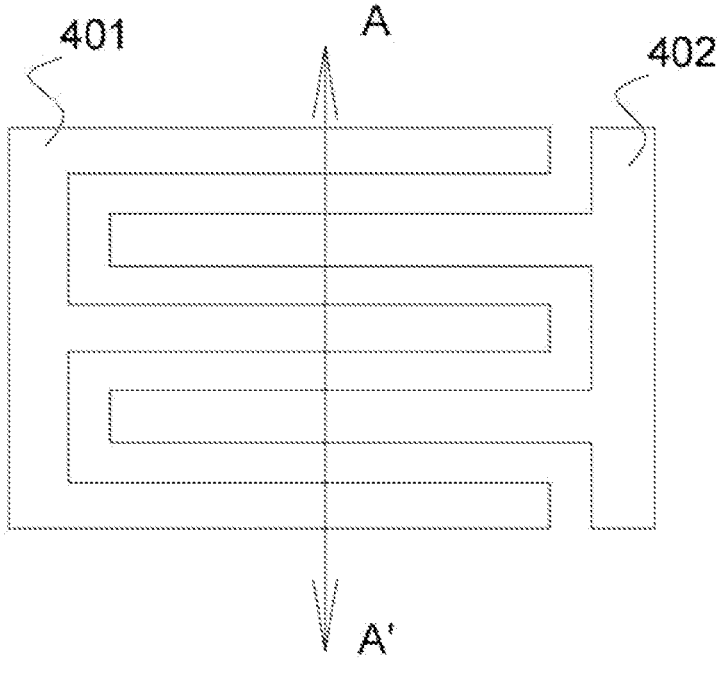
FIG. 4 is a schematic top view of a prototype structure body designed with a curved division groove.
FIG. 5 is a schematic cross-sectional view of a prototype structure body designed with a curved division groove in the A-A' direction.

A2, grooving the basic structure body: forming a curve-shaped division groove penetrating from the top layer to the bottom layer of the basic structure body, and dividing the basic structure body into two staggered and separated interdigitated structures 401 and 402 by the division groove, referring to FIG. 4 and FIG. 5.

Figure 6:
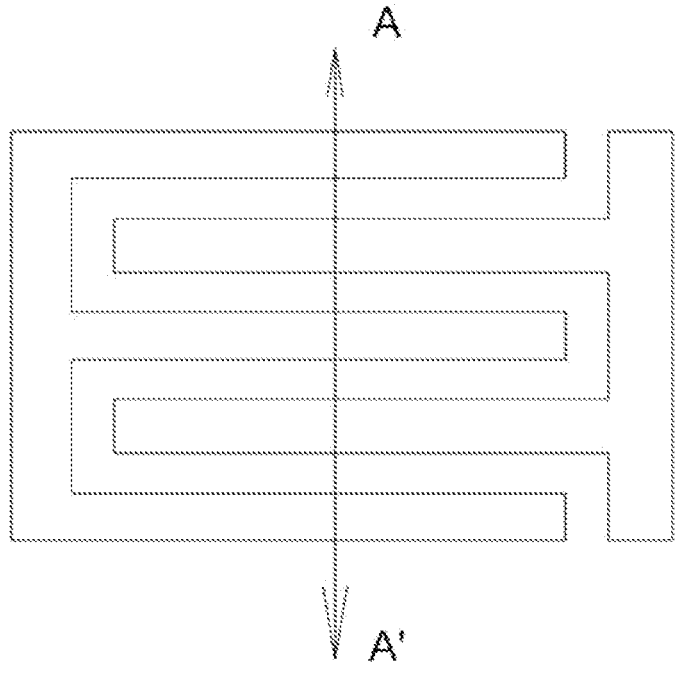
FIG. 6 is a schematic top view of a prototype structure body in the A1 step of the first embodiment.
Figure 7:
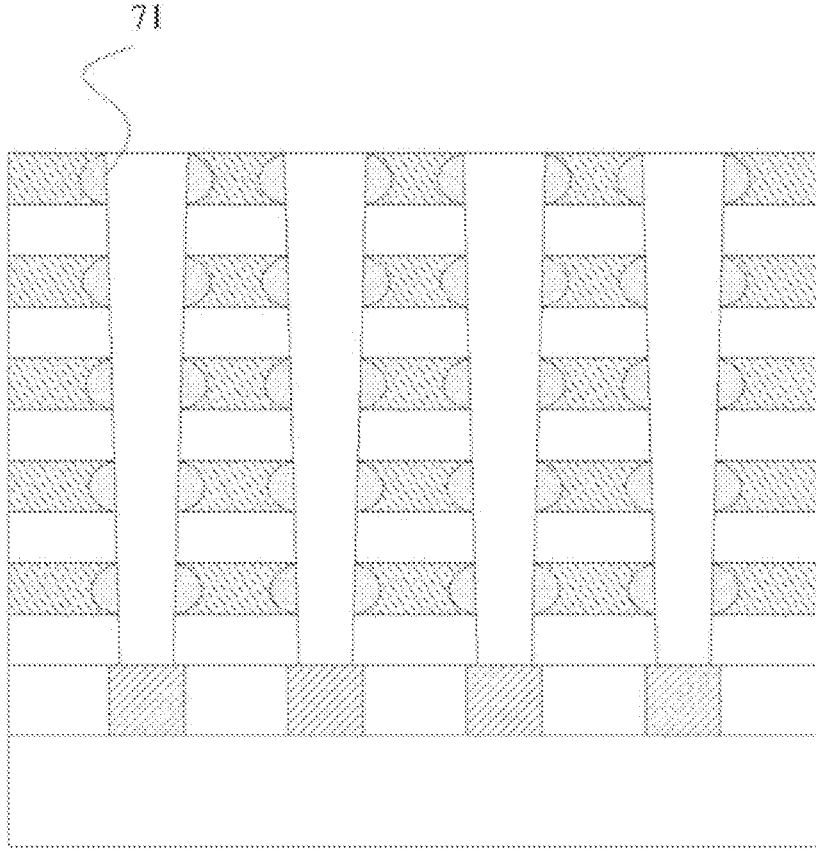
FIG. 7 is a schematic cross-sectional view of a prototype structure body in the A-A' direction in the A1 step of the first embodiment.

A3, performing inversion doping diffusion or impurity out-diffusion on the first conducting medium located at the inner wall of the division groove to form a buffer region 71 made of a lightly-doped semiconductor material in the surface area of the first conducting medium on the inner wall of the division groove, referring to FIG. 6 and FIG. 7.

Figure 8:
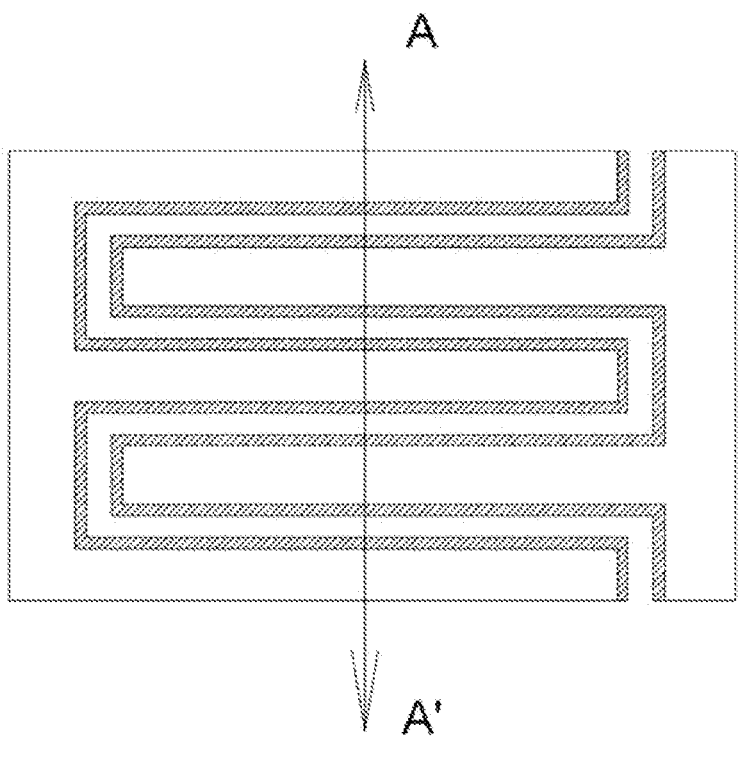
FIG. 8 is a schematic top view of a prototype structure body in the A2 step of the first embodiment.
Figure 9:
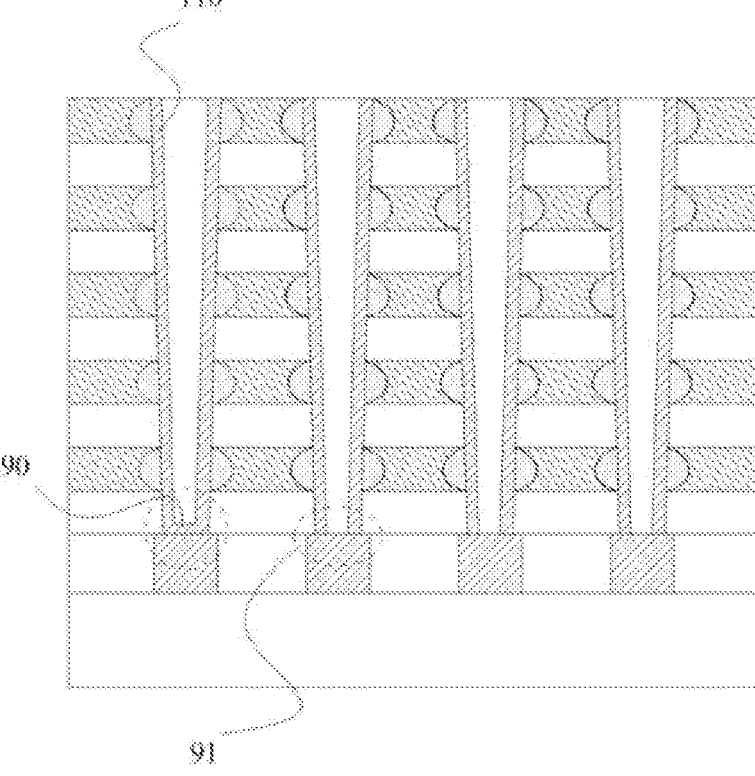
FIG. 9 is a schematic cross-sectional view of a prototype structure body in the A-A' direction in the A2 step of the first embodiment.

A4, depositing an insulating material as a memory medium on the inner wall of the division groove to form a memory medium layer 110 covering the inner wall of the memory cell hole, referring to FIG. 8 and FIGS. 9; and 90 and 91 in FIG. 9 illustrate two penetration methods, seeing details as follows.

Figure 10:
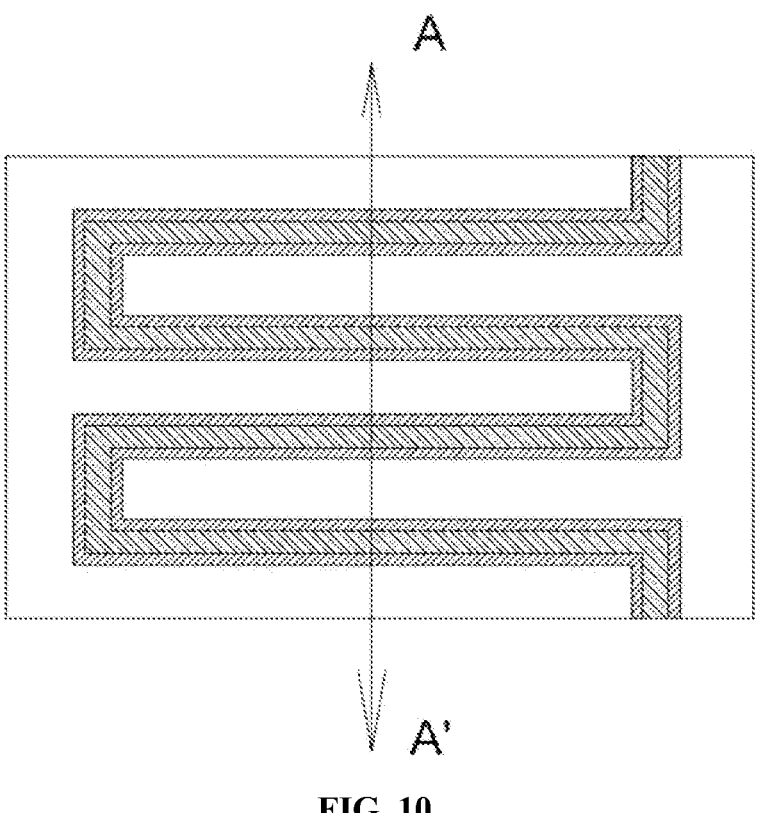
FIG. 10 is a schematic top view of a prototype structure body in the A3 step of the first embodiment.
Figure 11:
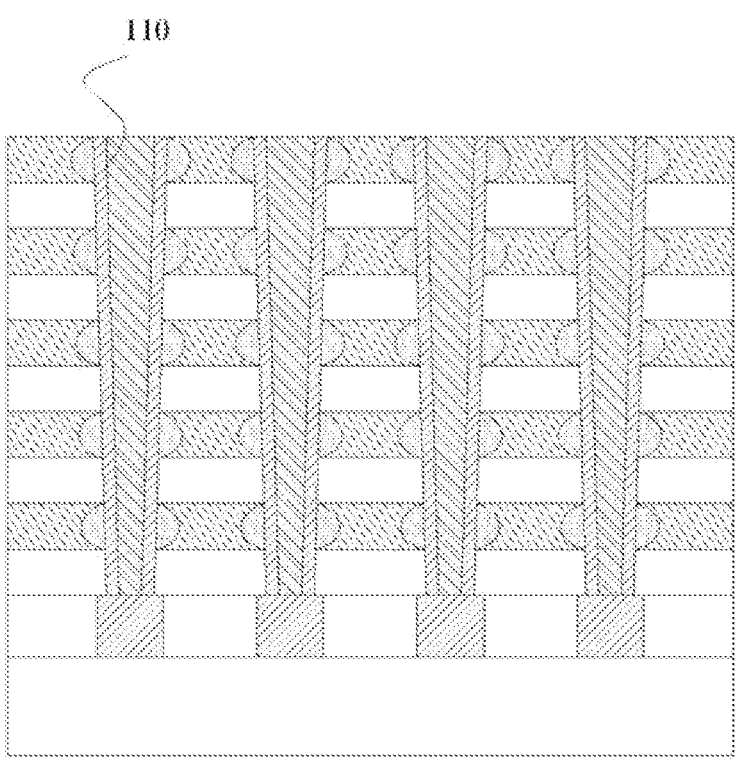
FIG. 11 is a schematic cross-sectional view of a prototype structure body in the A-A' direction in the A3 step of the first embodiment.

A5, filling an insulating medium in the division groove, referring to FIG. 10 and FIG. 11.

Figure 12:
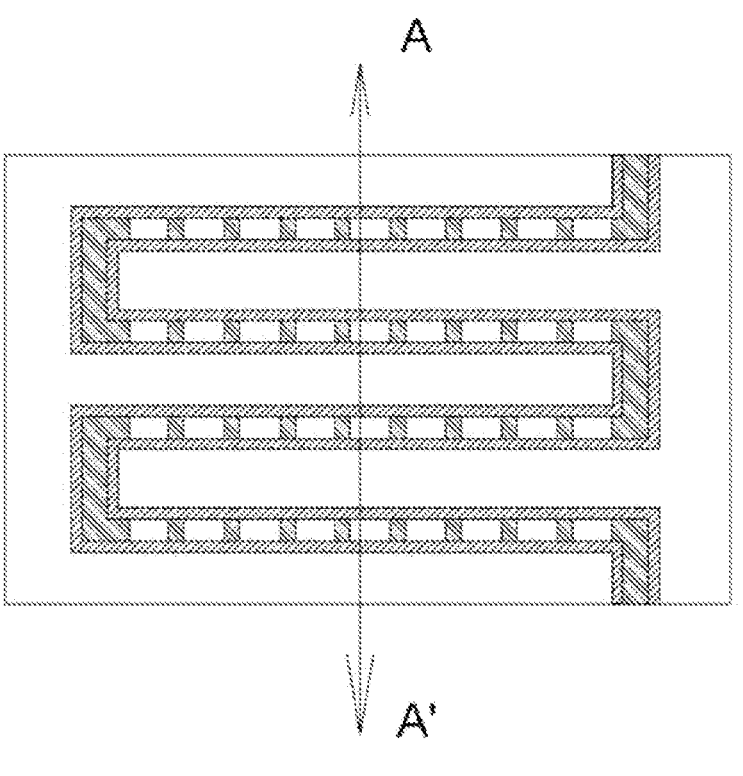
FIG. 12 is a schematic top view of a prototype structure body in the A4 step of the first embodiment.
Figure 13:
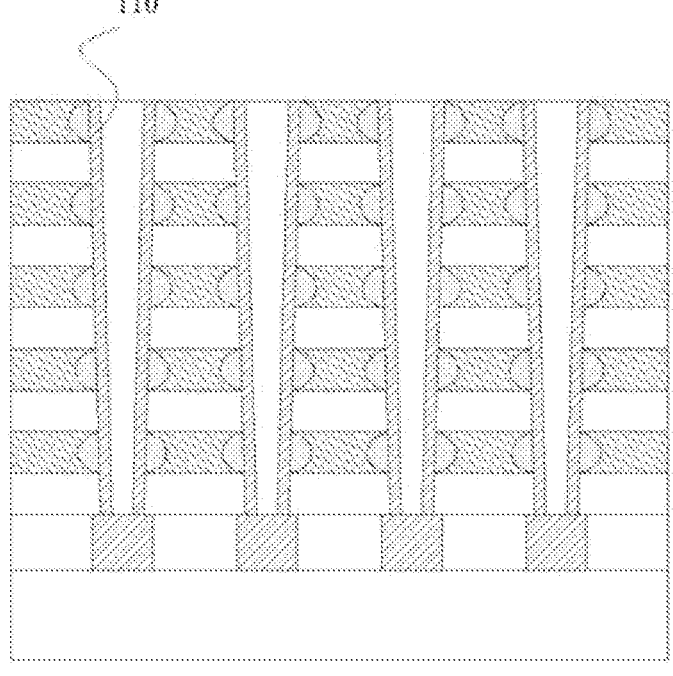
FIG. 13 is a schematic cross-sectional view of a prototype structure body in the A-A' direction in the A4 step of the first embodiment.

A6, using a mask etching process to get memory cell holes along the division groove filled with the insulating medium, and the basic structure body is exposed to the etched memory cell holes. In the present disclosure, the insulating medium between every two adjacent memory cell holes can be as small as possible in thickness, or, the distance between every two adjacent memory cell holes can be as small as possible (such as 10 nm and below) according to current mature etching technology and is kept no lower than the breakdown thickness of the insulating medium (such as the breakdown thickness of a silicon dioxide layer being 0.5-5 nm), referring to FIG. 12 and FIG. 13.

Figure 14:
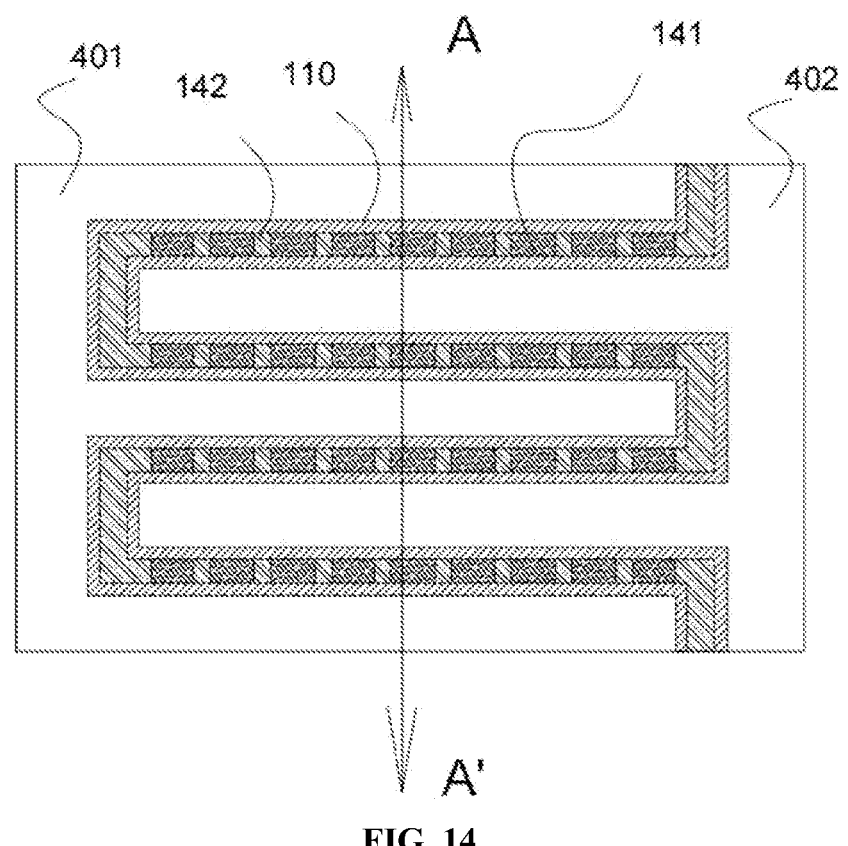
FIG. 14 is a schematic top view of a prototype structure body in the A5 step of the first embodiment.
Figure 15:
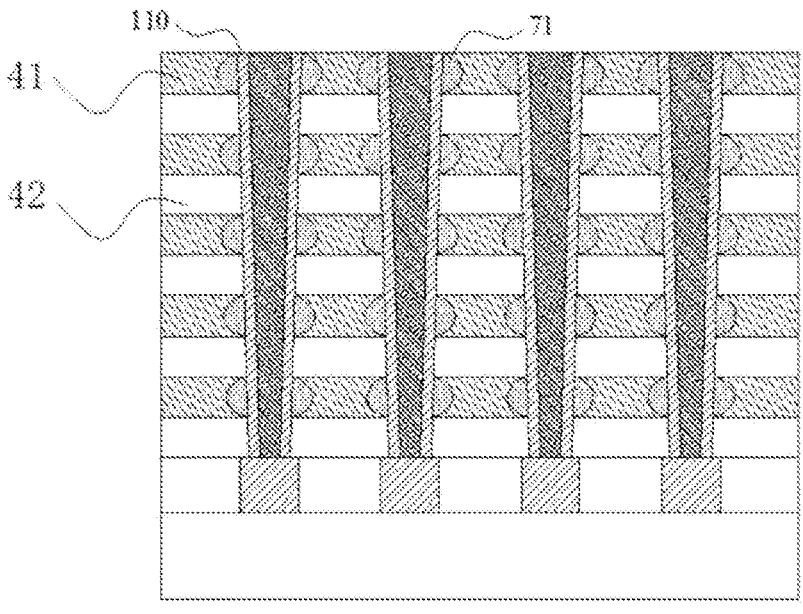
FIG. 15 is a schematic cross-sectional view of a prototype structure body in the A-A' direction in the A5 step of the first embodiment.

A7, placing the vertical electrode in the memory cell hole, referring to FIG. 14 and FIG. 15.

After the deposition process in step A4, an isolation will be formed in the bottom area of the division groove, and the vertical electrode in the memory cell hole in step A7 is isolated from the underlying circuit. Therefore, the insulating medium deposited at the bottom of the division groove needs to be penetrated, so that the vertical electrode and the underlying circuit are in a conductive connection.

In the first penetration method, after step A6 is completed, penetration holes are etched in the insulating medium at the bottom area until the underlying circuit is exposed, so that the vertical electrodes disposed in step A7 are in direct contact with the underlying circuit, and the method is called etching penetration, referring to 91 as shown in FIG. 9.

In the second penetration method, before step A7, the insulating medium at the bottom is not dealt with, referring to 90 as shown in FIG. 9. After the vertical electrode is formed, a breakdown voltage is applied between the vertical electrode and the underlying circuit, and the insulating medium at the bottom in the memory cell hole, between the vertical electrode and the underlying circuit, is broken down to become a conductive connection.

Embodiment II

This embodiment is the second embodiment of the fabrication method. The fabrication method comprises the following steps:

B1, forming a basic structure body on an underlying circuit 43: setting up a preset number of first conducting medium layers and insulating medium layers in such as manner that the first conducting medium layers 41 and the insulating medium layers 42 are alternately stacked on top of each other to form a basic structure body, referring to FIG. 2 and FIG. 3;

B2, grooving the basic structure body: forming a curve-shaped division groove penetrating from the top layer to the bottom layer of the basic structure body, and dividing the basic structure body into two staggered and separated interdigitated structures by the division groove, referring to FIG. 4 and FIG. 5;

B3, performing inversion doping diffusion or impurity out-diffusion on the first conducting medium located on the inner wall of the division groove, so that the first conducting medium close to the inner wall of the division groove forms a buffer region 71 made of a lightly-doped semiconductor material, referring to FIG. 6 and FIG. 7.

Figure 16:
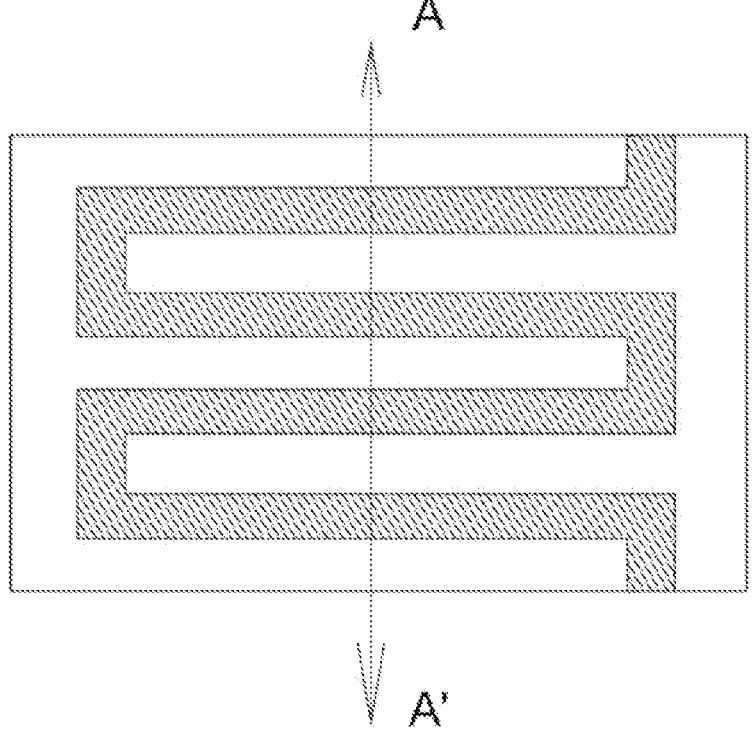
FIG. 16 is a schematic top view of a prototype structure body in the B4 step of the second embodiment.
Figure 17:
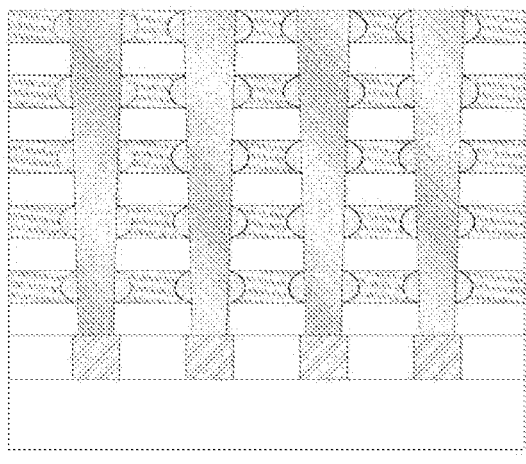
FIG. 17 is a schematic cross-sectional view of a prototype structure body in the A-A' direction in the B4 step of the second embodiment.

B4, filling an insulating medium in the division groove, referring to FIG. 16 and FIG. 17.

Figure 18:
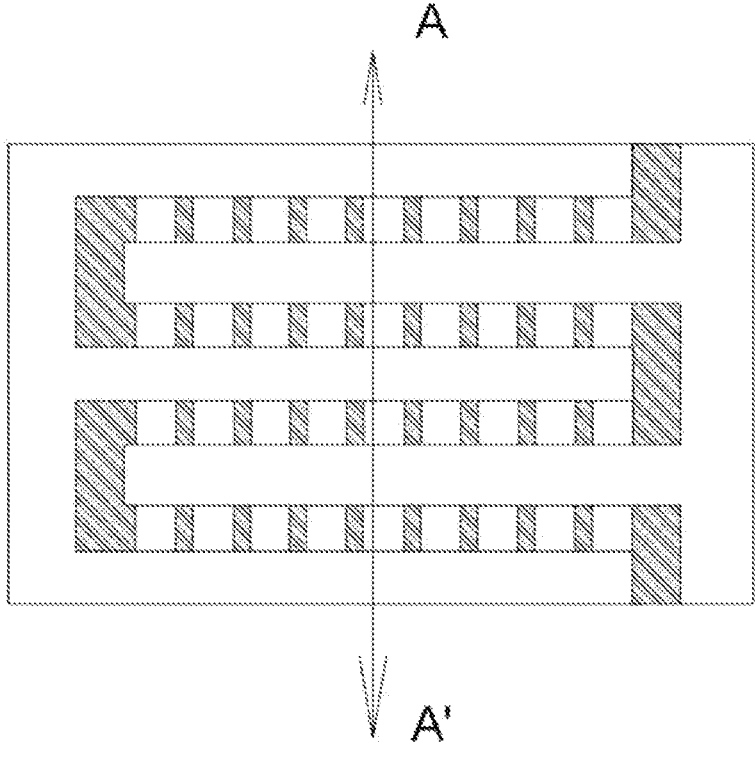
FIG. 18 is a schematic top view of a prototype structure body in the B5 step of the second embodiment.
Figure 19:
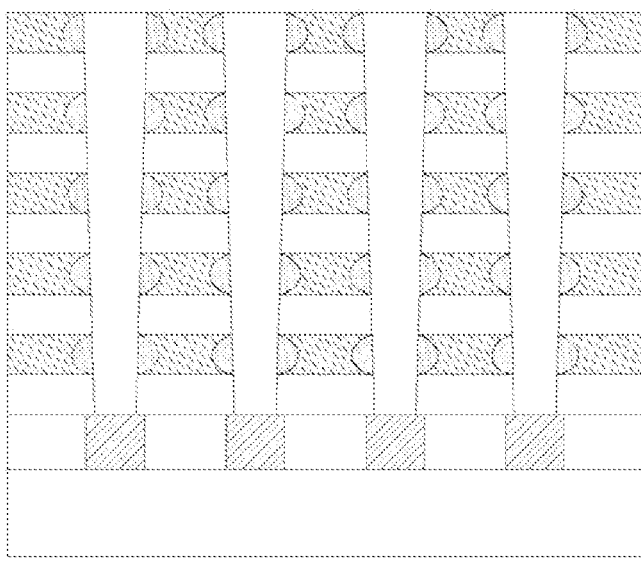
FIG. 19 is a schematic cross-sectional view of a prototype structure body in the A-A' direction in the B5 step of the second embodiment.

B5, etching an insulating medium in the division groove to form memory cell units, as shown in FIG. 18 and FIG. 19.

Figure 20:
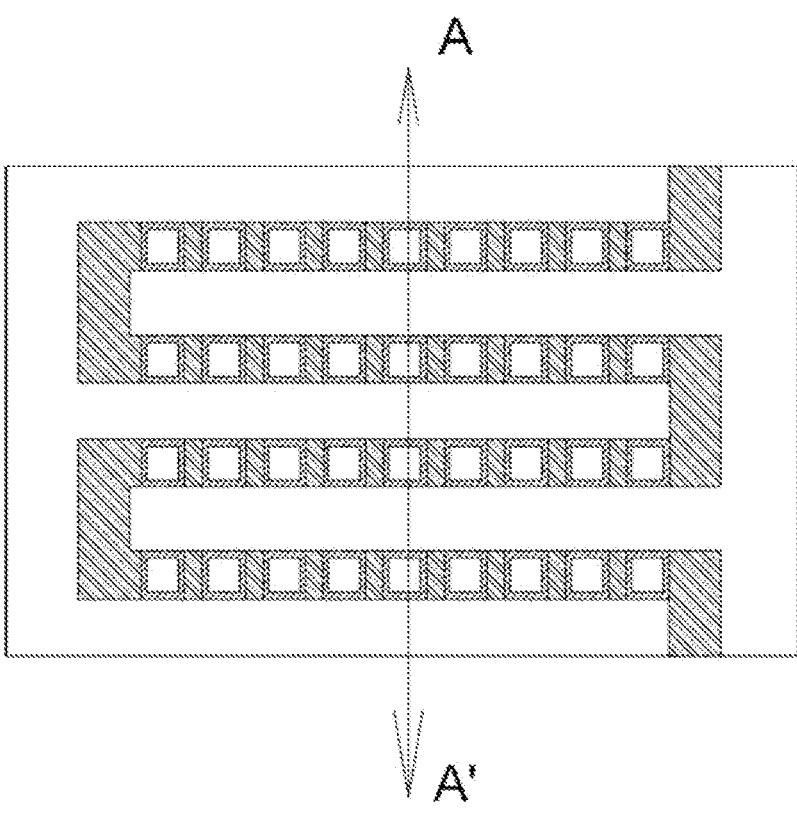
FIG. 20 is a schematic top view of a prototype structure body in the B6 step of the second embodiment.
Figure 21:
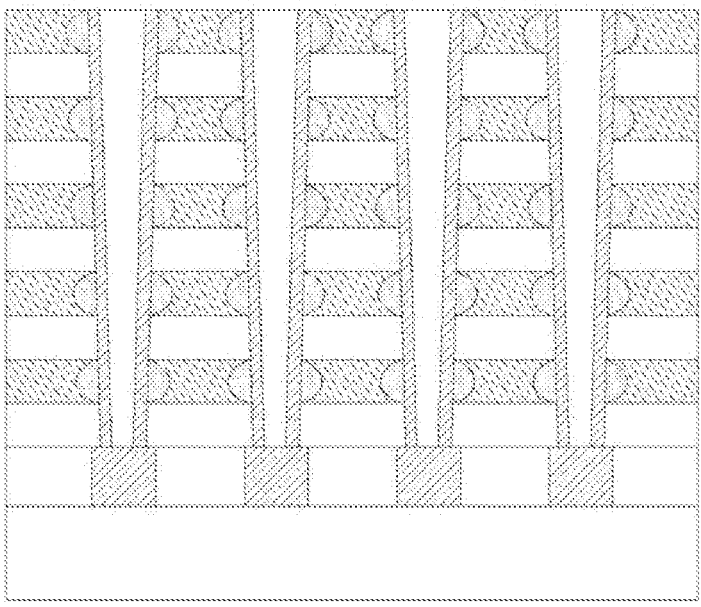
FIG. 21 is a schematic cross-sectional view of a prototype structure body in the A-A' direction in the B6 step of the second embodiment.

B6, depositing an insulating material as a memory medium on the inner wall of the division groove to form a memory medium layer covering the inner wall of the memory cell hole, as shown in FIG. 20 and FIG. 21.

Figure 22:
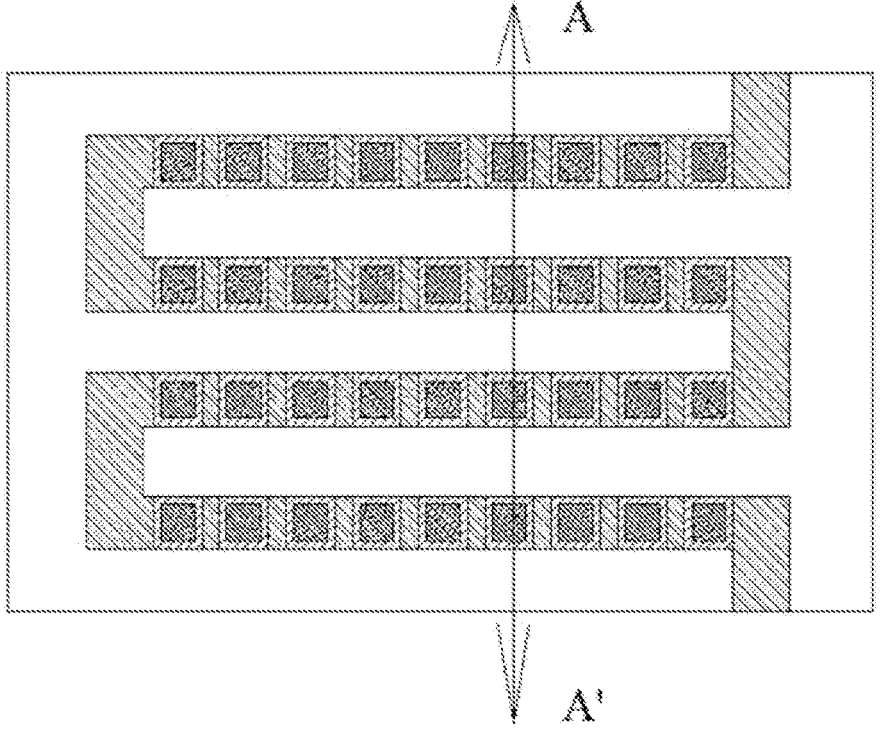
FIG. 22 is a schematic top view of a prototype structure body in the B7 step of the second embodiment.
Figure 23:
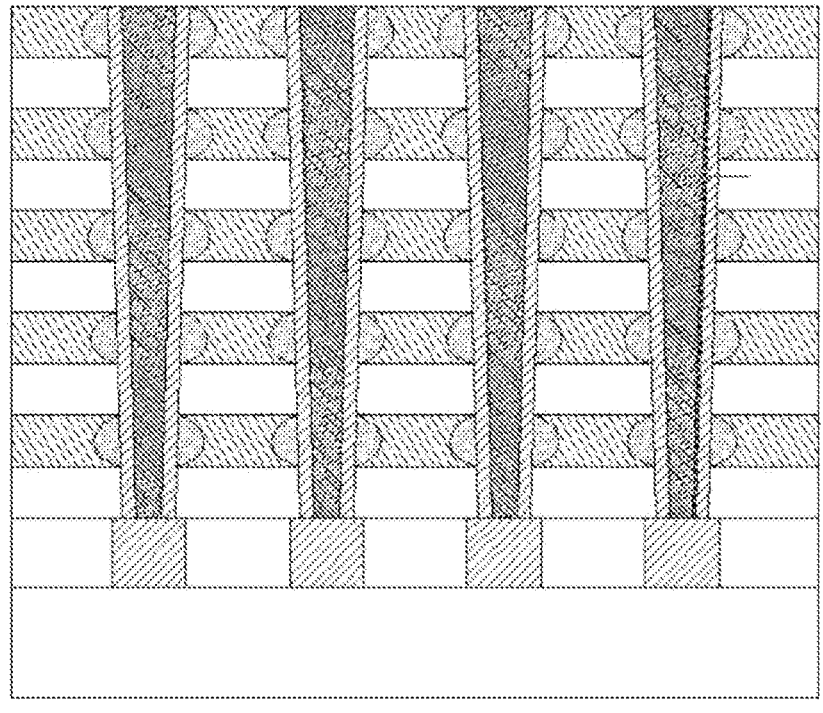
FIG. 23 is a schematic cross-sectional view of a prototype structure body in the A-A' direction in the B7 step of the second embodiment.

B7, placing a vertical electrode in the memory cell unit, as shown in FIG. 22 and FIG. 23.

The penetration of the insulating medium at the bottom area in the memory cell hole is similar to that of the first embodiment.

Embodiment III

This embodiment is the third embodiment of the fabrication method. The fabrication method comprises the following steps:

C1, forming a basic structure body on an underlying circuit 43: setting up a preset number of first conducting medium layers and insulating medium layers in such a manner that the first conducting medium layers 41 and the insulating medium layers 42 are alternately stacked on top of each other to form a basic structure body, referring to FIG. 2 and FIG. 3.

C2, grooving the basic structure body: forming a curve-shaped division groove penetrating from the top layer to the bottom layer of the basic structure body, and dividing the basic structure body into two staggered and separated interdigitated structures by the division groove, referring to FIG. 4 and FIG. 5.

Figure 24:
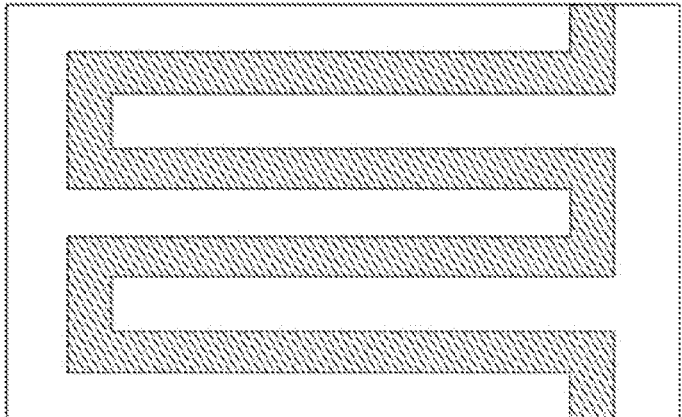
FIG. 24 is a schematic top view of a prototype structure body in the D3 step of the fourth embodiment.
Figure 25:
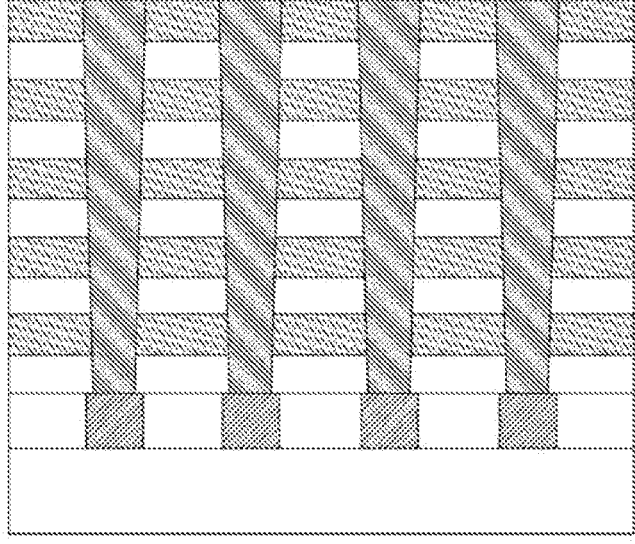
FIG. 25 is a schematic cross-sectional view of a prototype structure body in the A-A' direction in the D3 step of the fourth embodiment.

C3, filling an insulating medium in the division groove, referring to FIG. 24 and FIG. 25.

Figure 26:
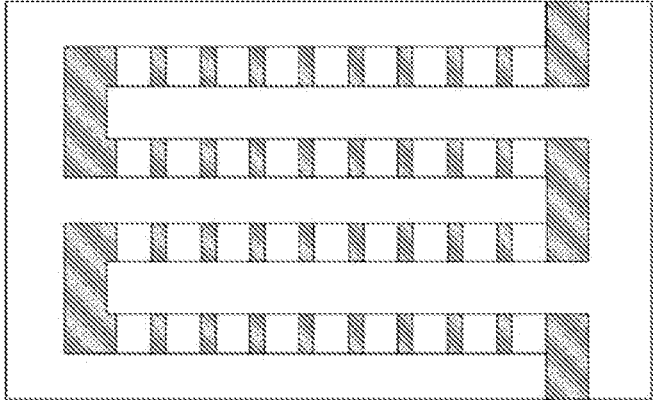
FIG. 26 is a schematic top view of a prototype structure body in the D4 step of the fourth embodiment.
Figure 27:
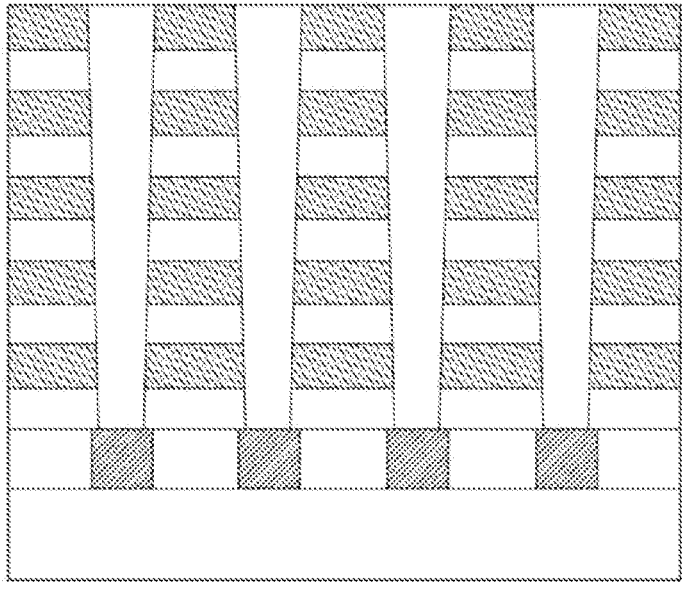
FIG. 27 is a schematic cross-sectional view of a prototype structure body in the A-A' direction in the D4 step of the fourth embodiment.

C4, etching the insulating medium in the division groove to form the memory cell holes, as shown in FIG. 26 and FIG. 27.

Figure 28:
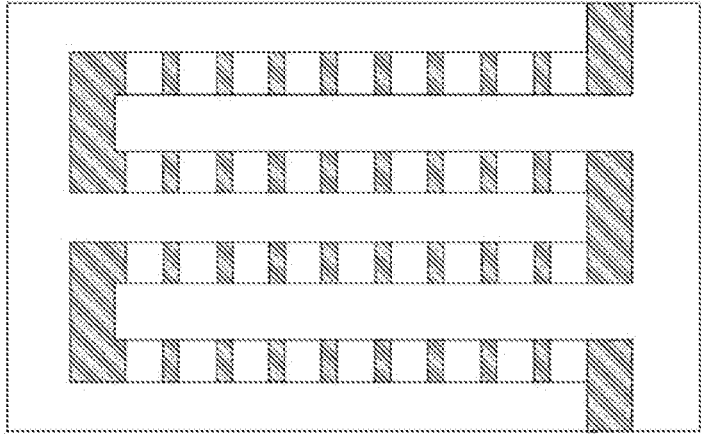
FIG. 28 is a schematic top view of a prototype structure body in the D5 step of the fourth embodiment.
Figure 29:
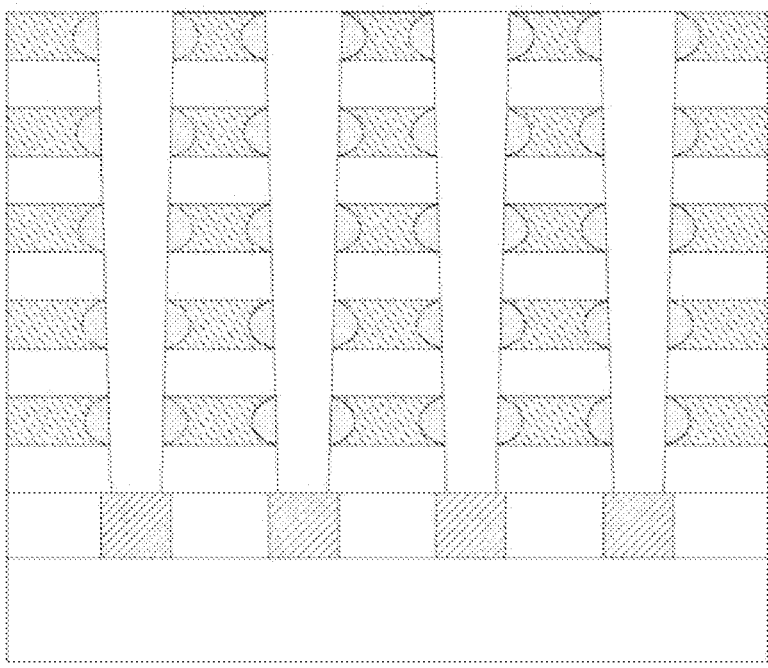
FIG. 29 is a schematic cross-sectional view of a prototype structure body in the A-A' direction in the D5 step of the fourth embodiment.

C5, performing inversion doping diffusion or impurity out-diffusion on the first conducting medium located at the inner wall of the division groove so that the first conducting medium close to the inner wall of the division groove forms the buffer region 71 made of a lightly-doped semiconductor material, as shown in FIG. 28 and FIG. 29.

Figure 30:
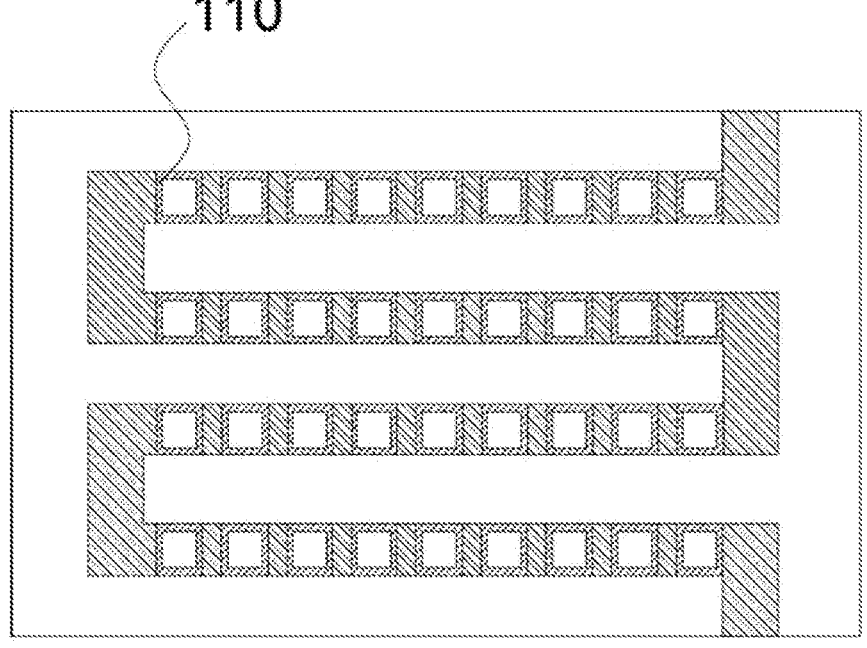
FIG. 30 is a schematic top view of a prototype structure body in the D6 step of the fourth embodiment.
Figure 31:
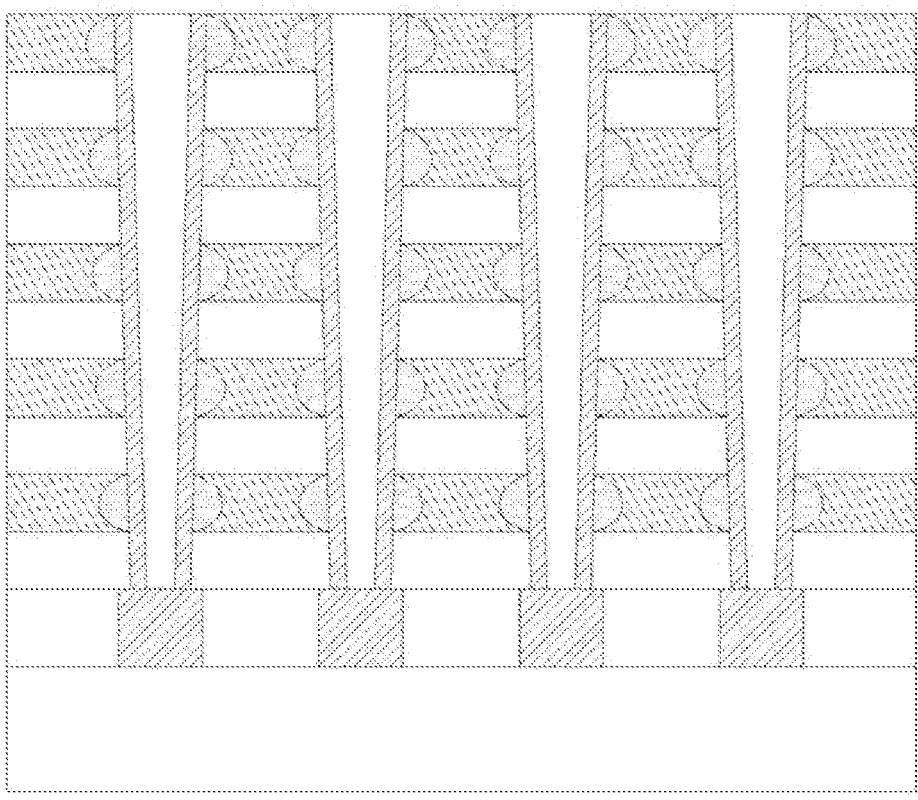
FIG. 31 is a schematic cross-sectional view of a prototype structure body in the A-A' direction in the D6 step of the fourth embodiment.

C6, depositing an insulating material on the inner wall of the memory cell hole as a memory medium to form a memory medium layer 110 covering the inner wall of the memory cell hole, as shown in FIG. 30 and FIG. 31.

Figure 32:
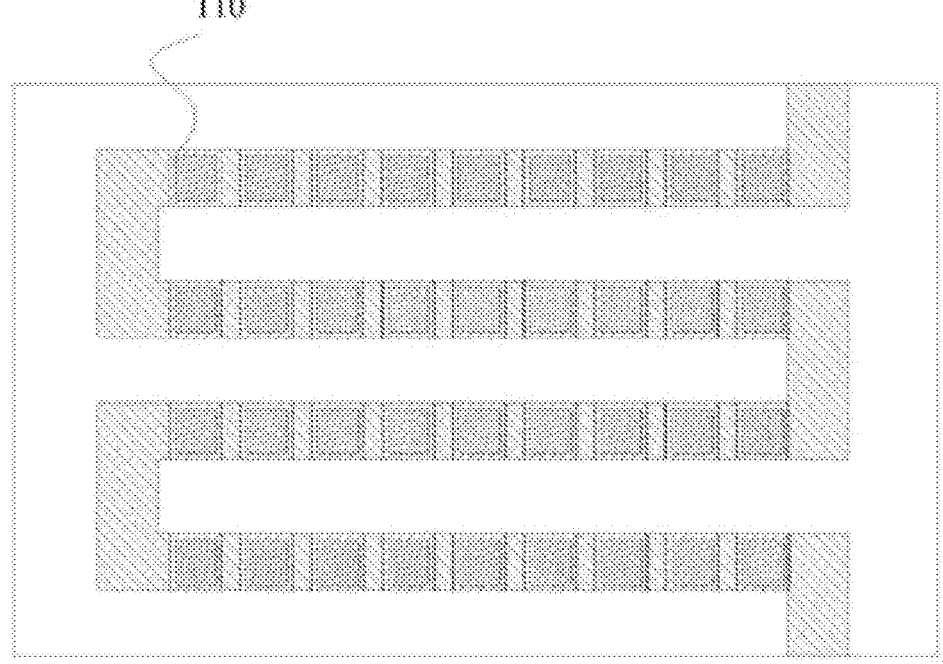
FIG. 32 is a schematic top view of a prototype structure body in the D7 step of the fourth embodiment.
Figure 33:
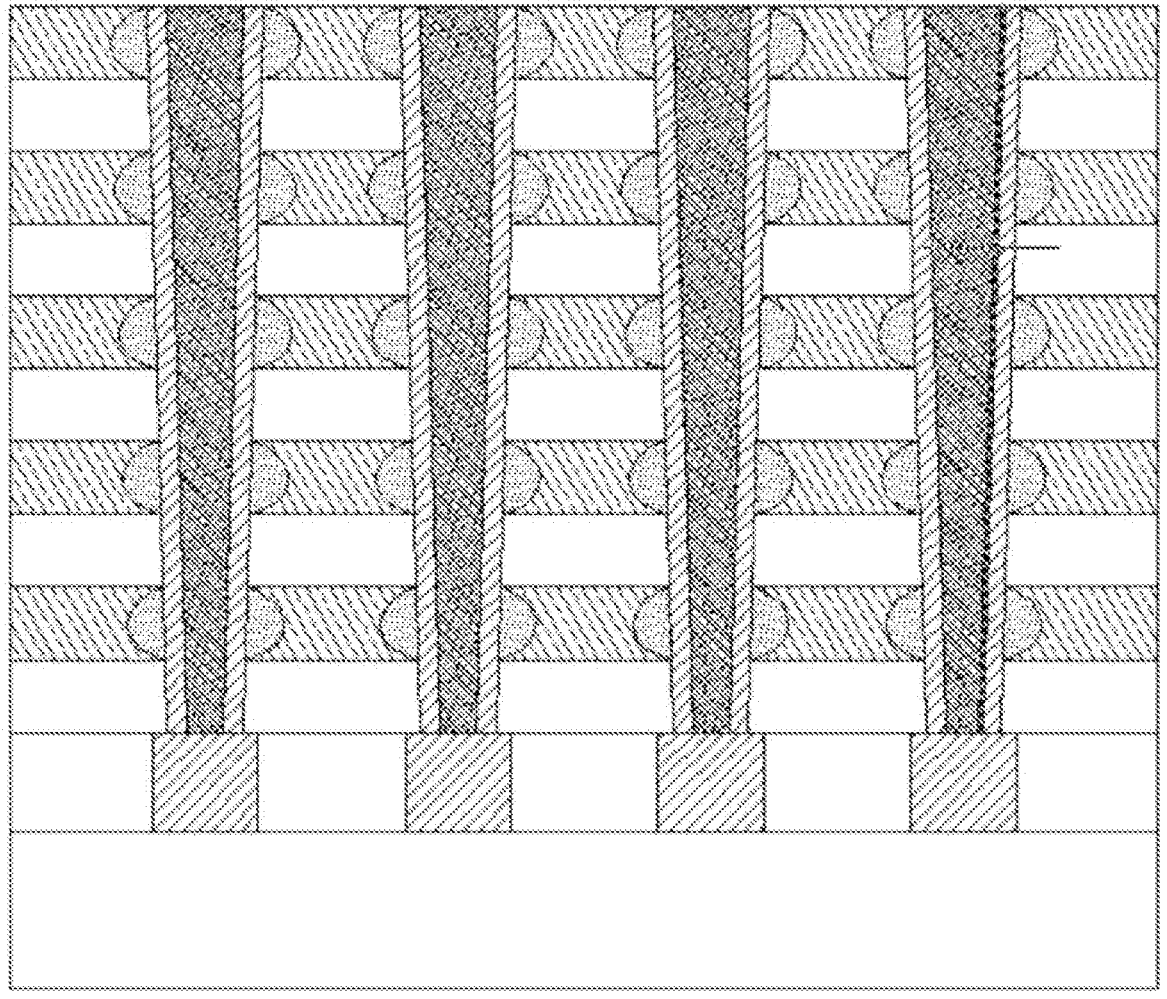
FIG. 33 is a schematic cross-sectional view of a prototype structure body in the A-A' direction in the D7 step of the fourth embodiment.

C7, placing a vertical electrode in the memory cell hole, as shown in FIG. 32 and FIG. 33.

The penetration of the insulating medium at the bottom area in the memory cell hole is similar to that of the first embodiment.

The thickness of the buffer layer can be optimized according to device performance, and the device performance will not be influenced even if the thickness of the buffer layer reaches half of the width of the isolation groove so that the buffer layers of the adjacent memory cells are fused.

Embodiment IV

The structure in this embodiment can refer to FIG. 32 and FIG. 33.

In this embodiment, the memory is a high-density three-dimensional multilayer memory. The high-density three-dimensional multilayer memory comprises an underlying circuit part and a basic structure body disposed above the underlying circuit part, wherein the basic structure body is divided into two independent interdigitated structures, referred to as a first interdigitated structure 401 and a second interdigitated structure 401 (referring to FIG. 4 and FIG. 14) respectively, by a curve-shaped division groove, wherein the basic structure body comprises first conducting medium layers 41 and insulating medium layers 42 alternately stacked on top of each other from bottom to top, wherein at least three memory cell holes are formed in the curve-shaped division groove side by side, wherein a vertical electrode 141 is disposed in each memory cell hole, and an insulating isolation pillar 142 is disposed between every two adjacent memory cell holes.

At least one vertical electrode meets the following two conditions at the same time: the vertical electrode, and one of the first conducting medium layers in the first interdigitated structure, together with the memory medium in between the two, form a preset memory. And the same vertical electrode and one of first conducting medium layers in the second interdigitated structure, together with the memory medium 110 between the two form another preset memory.

The preset memory can be one of the following memories:

a PN junction type semiconductor memory and a Schottky semiconductor memory.

The memory medium is set in the memory cell hole to form the memory medium layer covering the inner wall of the division groove.

The memory medium is an insulating medium.

A buffer region 71 is placed in the first conducting medium layer close to the memory medium, and the buffer region 71 is entirely or partially embedded in the first conducting medium layer, and the buffer region is connected with the memory medium. The buffer region is made of a lightly-doped semiconductor material.

The vertical electrode is in an electrical connection with the underlying circuit part.

The first conducting medium is made of a P-type semiconductor, and the vertical electrode is made of an N-type semiconductor, wherein the buffer region is made of a semiconductor material of which the doping type is the same as that of the first conducting medium and the doping concentration is lower than that of the first conducting medium.

Or, the first conducting medium layer is an N-type semiconductor, and the vertical electrode is made of a P-type semiconductor, wherein the buffer region is made of a semiconductor material of which the doping type is the same as that of the first conducting medium and the doping concentration is lower than that of the first conducting medium.

Or, the first conducting medium layer is made of a semiconductor material meeting the requirement of a Schottky diode, and the vertical electrode is made of a metal meeting the requirement of the Schottky diode, wherein the buffer region is made of a semiconductor material of which the doping type is the same as that of the first conducting medium and the doping concentration is lower than that of the first conducting medium.

What is claimed is:

1. A fabrication method of a high-density three-dimensional multilayer memory, comprising the following steps:

firstly, forming a basic structure body: setting up a preset number of first conducting medium layers and insulating medium layers in such as manner that the first conducting medium layers and the insulating medium layers are alternately stacked on top of each other to form a basic structure body;

secondly, grooving the basic structure body: forming a curve-shaped division groove penetrating from the top layer to the bottom layer of the basic structure body, and dividing the basic structure body into two staggered and separated interdigitated structures by the division groove;

thirdly, forming a preset number of memory cell holes in the division groove, wherein an insulating medium is disposed between every two adjacent memory cell holes, a vertical electrode is disposed in the memory cell hole, and a memory medium layer is disposed between the vertical electrode and the interdigitated structure; the vertical electrode, the memory medium and the first conducting medium are made of materials meeting requirements of a preset memory, and the memory is a PN junction type semiconductor memory, a Schottky semiconductor memory, a resistance change memory, a magnetic phase change memory, a phase change memory or a ferroelectric memory; and in the forming step, before the memory medium is disposed, the fabrication method comprises the following step:

performing doping diffusion on the first conducting medium located on the inner wall of the division groove, so that the first conducting medium close to an inner wall of the division groove forms a buffer region made of a lightly-doped semiconductor material.

2. The fabrication method of a high-density three-dimensional multilayer memory according to claim 1, wherein in the third step, the memory cell hole is a through hole penetrating through the basic structure body.

3. The fabrication method of a high-density three-dimensional multilayer memory according to claim 1, wherein the third step comprises the following substeps:

performing specific deposition on the first conducting medium located on the inner wall of the division groove so that the first conducting medium close to the inner wall of the division groove forms the buffer region, wherein the conductive type of the buffer region is the same as that of the first conducting medium and a doping concentration of the buffer region is lower than that of the first conducting medium;

depositing the insulating material on the inner wall of the division groove as a memory medium to form a memory medium layer covering the inner wall of the division groove;

filling the insulating medium in the division groove, etching the filled insulating medium to form the memory cell holes disposed along the division groove until the basic structure body is exposed to the memory cell hole;

placing a vertical electrode in the memory cell hole; and the materials of the conducting medium layer, a middle medium layer and the vertical electrode layer meet one of the following conditions:

the first conducting medium layer is a P-type semiconductor, and the vertical electrode layer is an N-type semiconductor;

the first conducting medium layer is an N-type semiconductor, and the vertical electrode layer is a P-type semiconductor; and the first conducting medium layer is made of a semiconductor material meeting the requirement of a Schottky diode, and the vertical electrode is made of a metal meeting the requirement of the Schottky diode.

4. The fabrication method of a high-density three-dimensional multilayer memory according to claim 1, wherein the third step comprises the following substeps:

performing specific deposition on the first conducting medium located on the inner wall of the division groove so that the first conducting medium close to the inner wall of the division groove forms the buffer region, wherein the conductive type of the buffer region is the same as that of the first conducting medium and a doping concentration of the buffer region is lower than that of the first conducting medium;

filling the insulating medium in the division groove, etching the filled insulating medium to form the memory cell holes disposed along the division groove;

depositing an insulating material in the memory cell hole as a memory medium to form a memory medium layer covering the inner wall of the memory cell hole;

placing a vertical electrode in the memory cell hole; and the materials of the conducting medium layer, a middle medium layer and the vertical electrode layer meet one of the following conditions:

the first conducting medium layer is a P-type semiconductor, and the vertical electrode layer is an N-type semiconductor;

the first conducting medium layer is an N-type semiconductor, and the vertical electrode layer is a P-type semiconductor; and the first conducting medium layer is made of a semiconductor material meeting the requirement of a Schottky diode, and the vertical electrode is made of a metal meeting the requirement of the Schottky diode.

* * * * *